US012813247B2

(12) United States Patent
Motoyama et al.

(10) Patent No.: US 12,813,247 B2
(45) Date of Patent: Nov. 24, 2026

(54) METALLIZATION LEVELS WITH SKIP VIA AND DIELECTRIC LAYER

(71) Applicant: International Business Machines Corporation, Armonk, NY (US)

(72) Inventors: Koichi Motoyama, Clifton Park, NY (US); Chanro Park, Clifton Park, NY (US); Hsueh-Chung Chen, Cohoes, NY (US); Yann Mignot, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 17/980,281

(22) Filed: Nov. 3, 2022

(65) Prior Publication Data

US 2024/0153864 A1 May 9, 2024

(51) Int. Cl.

| | |
|---|---|
| ***H10W 20/42*** | (2026.01) |
| ***H10D 84/01*** | (2025.01) |
| ***H10D 84/03*** | (2025.01) |
| ***H10D 84/83*** | (2025.01) |
| ***H10D 84/85*** | (2025.01) |
| ***H10W 20/41*** | (2026.01) |

(52) U.S. Cl.

CPC ........ *H10W 20/42* (2026.01); *H10D 84/0149* (2025.01); *H10D 84/0186* (2025.01); *H10D 84/038* (2025.01); *H10D 84/834* (2025.01); *H10D 84/85* (2025.01); *H10W 20/435* (2026.01)

(58) Field of Classification Search

CPC ......... H01L 21/76816; H01L 21/76877; H01L 21/76879; H01L 21/7688; H01L 21/76882; H01L 21/76883; H01L 23/5226; H10W 20/421

See application file for complete search history.

(56) References Cited

U.S. PATENT DOCUMENTS

| | | | | |
|---|---|---|---|---|
| 9,805,972 | B1 | 10/2017 | Zhang et al. | |
| 10,020,254 | B1 | 7/2018 | Bao et al. | |
| 10,026,687 | B1 | 7/2018 | Lin et al. | |
| 10,109,526 | B1 | 10/2018 | Zhang et al. | |
| 10,485,111 | B2 | 11/2019 | Law et al. | |
| 10,586,012 | B2 | 3/2020 | Shao et al. | |
| 11,037,822 | B2 | 6/2021 | Mignot et al. | |
| 11,121,027 | B2 | 9/2021 | Lu et al. | |
| 2016/0276271 | A1* | 9/2016 | Chen | H10P 50/283 |
| 2018/0068949 | A1* | 3/2018 | Chen | H10P 14/6339 |
| 2019/0021176 | A1* | 1/2019 | Law | H05K 3/4038 |
| 2020/0388567 | A1* | 12/2020 | Mignot | H01L 21/76877 |
| 2021/0193513 | A1* | 6/2021 | Tien | H01L 23/5226 |
| 2021/0249354 | A1* | 8/2021 | Shih | H01L 23/5222 |
| 2021/0249434 | A1* | 8/2021 | Nishikawa | H10B 43/35 |
| 2022/0392800 | A1* | 12/2022 | Lim | H10D 84/0147 |

OTHER PUBLICATIONS

Altium Designer, "Build High Density Interconnect PCBS with Skip Vias," Retrieved from https://resources.altium.com/p/build-high-density-interconnect-pcbs-skip-vias, May 25, 2018, 5 pages.

* cited by examiner

*Primary Examiner* — Eric A. Ward

(74) *Attorney, Agent, or Firm* — Samuel Waldbaum; Ryan, Mason & Lewis, LLP

(57) ABSTRACT

A semiconductor structure includes a skip via disposed on a metal line of a first metallization layer, and a dielectric layer disposed on sidewalls of the skip via to define an opening. The dielectric layer has uniform sidewalls from an uppermost portion of the opening to a lowermost portion of the opening.

20 Claims, 10 Drawing Sheets

100

METALLIZATION LEVELS WITH SKIP VIA AND DIELECTRIC LAYER

BACKGROUND

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered schemes (e.g., single or dual damascene wiring structures) during the back-end-of-line (BEOL) phase of manufacturing. Within an interconnect structure, conductive vias can run perpendicular to the substrate and conductive lines can run parallel to the substrate.

SUMMARY

Illustrative embodiments of the present application include techniques for use in semiconductor manufacture. In an illustrative embodiment, a semiconductor structure comprises a skip via disposed on a metal line of a first metallization layer, and a dielectric layer disposed on sidewalls of the skip via to define an opening. The dielectric layer has uniform sidewalls from an uppermost portion of the opening to a lowermost portion of the opening.

According to another exemplary embodiment, a semiconductor structure comprises a skip via disposed on a metal line of a first metallization layer. The skip via comprises a first portion disposed in a first interlayer dielectric layer, and a second portion disposed in a second interlayer dielectric layer. The semiconductor structure further comprises a dielectric layer disposed on sidewalls of the first portion and the second portion of the skip via to define an opening. The dielectric layer has a varying thickness. The dielectric layer has uniform sidewalls from an uppermost portion of the opening to a lowermost portion of the opening.

According to yet another exemplary embodiment, an integrated circuit comprises one or more semiconductor structures. At least one of the one or more semiconductor structures comprises a skip via disposed on a metal line of a first metallization layer, and a dielectric layer disposed on sidewalls of the skip via to define an opening. The dielectric layer has uniform sidewalls from an uppermost portion of the opening to a lowermost portion of the opening.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1:
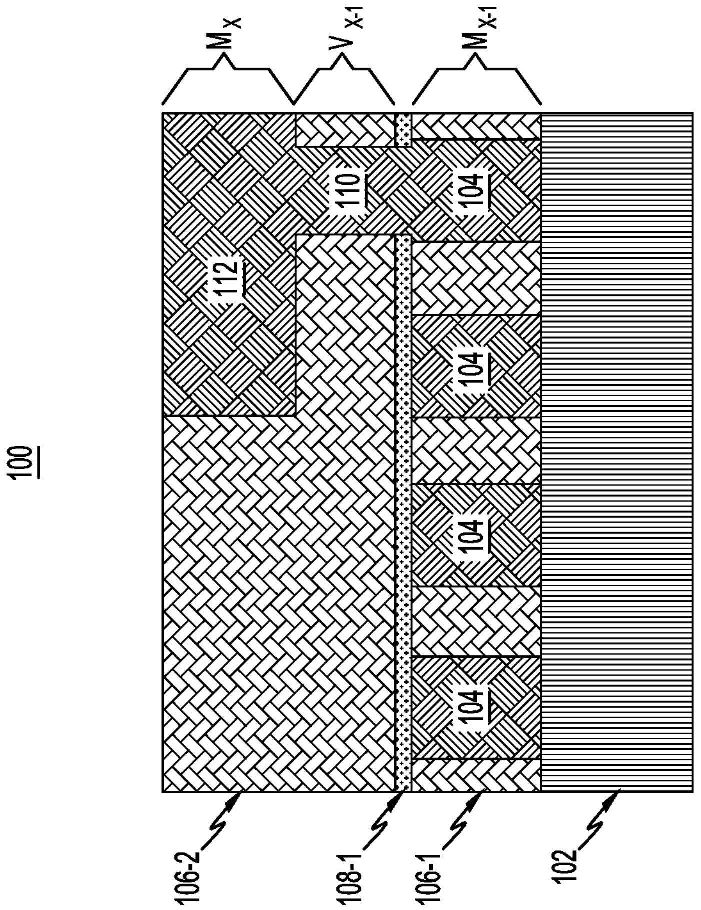
FIG. 1 is a cross-sectional view of a semiconductor structure at a first-intermediate fabrication stage, according to an illustrative embodiment.

This disclosure relates generally to semiconductor devices, and more particularly to skip via connections between metallization levels and methods for their fabrication. Exemplary embodiments will now be discussed in further detail with regard to semiconductor devices and methods of manufacturing same and, in particular, to skip via connections between metallization levels and methods for their fabrication.

A semiconductor device can include multiple metallization levels ("levels"), each including a conductive line ("line") formed in an interlayer dielectric layer (ILD). Although the term metallization is used herein, metallization levels can be formed to include any suitable conductive material in accordance with the embodiments described herein. Upper lines can be connected to lower lines by vias. Levels can be identified herein using the designation X, where X is a positive integer from 1 to N. The levels are identified from the level closest to the substrate to the level furthest from the substrate as 1 through N where 1 is the first or lowermost level and N is the last or uppermost level. A line in the X level is designated as an $M_X$ line, and a via in the X level is designated as a $V_{(X-1)}$ via. Note that there are no $V_0$ vias or via bars. When a line in an upper level is designated $M_X$, then a line in an immediately lower level can be designated $M_{(X-1)}$. Likewise, when a line in a lower level is designated $M_X$, then a line in an immediately higher level is designated $M_{(X+1)}$. For a first level (X=1), the line is $M_1$ and there are no "$V_0$" vias as the connection from $M_1$ to devices below $M_1$ is generally made through separately formed contacts in a contact layer ("CA"). For a second level (X=2), the line is $M_2$ and the vias are $V_1$ and, for a third level (X=3), the line is $M_3$ and the vias or via bars are $V_3$.

A skip via in accordance with the embodiments described herein can provide a connection between conductive lines of respective metallization levels in a manner that bypasses an intermediate metallization level. Skip vias are typically formed through one or more dielectric layers to establish an electrically conductive connection between a pair of targeted metallization layers, while bypassing (i.e., avoiding an electrically conductive connection) with one or more intervening metallization layers located between the targeted metallization layers.

Presently, a method to form a skip via involves forming a single via through the interconnect structure, and then subsequently performing a single metal fill process that fills the via with a metal material to form the skip via. This method, however, has a tendency to form metal fill voids due to undercut and a bowing profile which can result in potential short risk between the skip via and adjacent metal lines.

The illustrative embodiments described herein overcome the foregoing drawbacks by providing for the fabrication of a skip via having a partial dielectric fill on sidewalls of the skip via thereby eliminating bowing in the formation of skip vias. This, in turn, can prevent any potential short risk between the skip via and adjacent metal lines.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Referring now to the drawings in which like numerals represent the same of similar elements, FIGS. 1-10 illustrate various processes for fabricating skip via connections between metallization levels. Note that the same reference numeral (100) is used to denote the semiconductor structure through the various intermediate fabrication stages illustrated in FIGS. 1-10. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1-10 are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

FIG. 1 is a cross-sectional view of a semiconductor structure 100 at a first-intermediate fabrication stage. Semiconductor structure 100 includes a substrate layer 102. The substrate layer 102 can include a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon. The substrate layer 102 can include a bulk semiconductor substrate or a semiconductor-on-insulator (SOI) substrate. Also, substrate layer 102 can be at least one semiconductor device such as a field effect transistor, a bipolar transistor, a diode, a resistor, a capacitor, an inductor, an electrically programmable fuse, or any combination thereof.

Semiconductor structure 100 further includes a first metallization level $M_{x-1}$ having a plurality of metal containing lines 104 disposed on substrate layer 102 and dielectric layer 106-1 disposed on substrate layer 102 and between adjacent metal containing lines 104. First metallization layer $M_{x-1}$ with metal containing lines 104 may be formed from any suitable conductive metal including, for example, copper (Cu), aluminum (Al), chromium (Cr), cobalt (Co), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, a conductive metal layer is one or more of Al, Ru, Ta, Ti or W. In one embodiment, a conductive metal is Ru. The plurality of metal containing lines 104 may be formed using photolithography, etching and deposition processes. For example, in some embodiments, a pattern (not shown) is produced on the metal layer by applying a photoresist to the surface to be etched; exposing the photoresist to a pattern of radiation; and then developing the pattern into the photoresist utilizing resist developer. Once the patterning of the photoresist is completed, the photoresist is removed. The etch process may be an anisotropic etch, such as reactive ion etch (RIE). The etch process may also be a selective etch process.

A dielectric layer 106-1 is deposited on substrate layer 102 and in between adjacent metal containing lines 104. Dielectric layer 106-1 may be made of any known dielectric material such as, for example, silicon oxide, silicon nitride, hydrogenated silicon carbon oxide, low-k dielectrics, ultralow-k dielectrics, flowable oxides, porous dielectrics, or organic dielectrics including porous organic dielectrics. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra-low-k dielectric materials have a nominal dielectric constant less than 2.5. Suitable ultra-low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like.

The dielectric layer 106-1 may be formed by any suitable deposition technique known in the art, including atomic layer deposition (ALD), chemical vapor deposition (CVD), plasma enhanced chemical vapor deposition (PECVD), physical vapor deposition (PVD), molecular beam deposition (MBD), pulsed laser deposition (PLD), chemical solution deposition or other like processes.

Although the first metallization level $M_{x-1}$ is shown as being formed directly on the substrate layer 102, the semiconductor structure 100 is not limited thereto. For example, one or more additional layers including, but not limited to, an adhesion layer, a nucleation layer and/or an etch stop layer can be formed between the substrate layer 102 and the first metallization level $M_{x-1}$.

Semiconductor structure 100 further includes a first via level $V_{x-1}$ and a second metallization level $M_x$ formed on etch stop layer 108-1. Etch stop layer 108-1 is deposited on dielectric layer 106-1 and metal containing lines 104 using conventional deposition techniques such as ALD. The etch stop layer 108-1 is a dielectric material such as SiN and SiCN.

First via level $V_{x-1}$ and second metallization level $M_x$ include dielectric layer 106-2 having via 110 and metal containing line 112 disposed therein. For example, dielectric layer 106-2 is patterned and subjected to an etching process such as a wet or dry etch to form via 110 of first via level $V_{x-1}$, with the etch stop layer 108-1 at the bottom of via 110 being removed by a dry etching. Dielectric layer 106-2 can be formed by a similar process and of similar material as dielectric layer 106-1. Metal containing line 112 is connected to one of metal containing lines 104 through via 110. Via 110 and metal containing line 112 can be formed of any of the conductive metals discussed above for metal containing lines 104.

Figure 2:
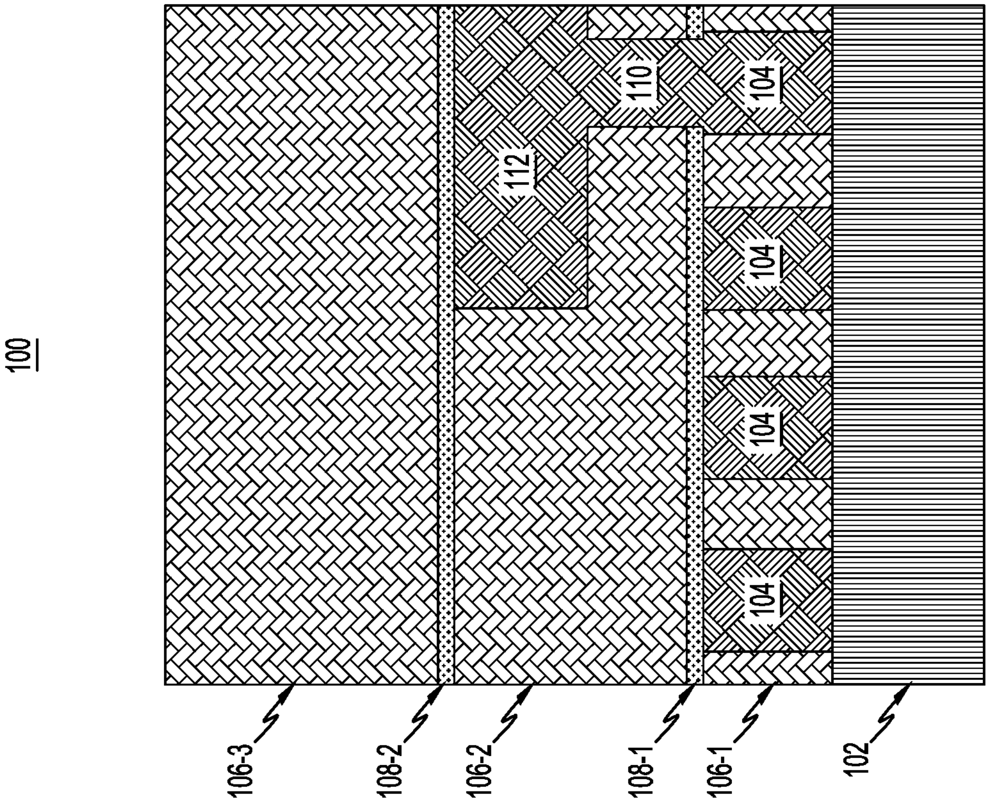
FIG. 2 is a cross-sectional view illustrating the semiconductor structure at a second-intermediate fabrication stage, according to an illustrative embodiment.

FIG. 2 illustrates a cross-sectional view of semiconductor structure 100 at a second-intermediate fabrication stage for initially fabricating a third metallization layer $M_{x+1}$ and a second via level $V_x$ as discussed further below. During this stage, a etch stop layer 108-2 is deposited on top of dielectric layer 106-2 and metal containing line 112. Etch stop layer 108-2 can be formed by any similar process and similar material as etch stop layer 108-1. Next, a dielectric layer 106-3 is formed on top of etch stop layer 108-2. Dielectric layer 106-3 can be formed by a similar process and of similar material as dielectric layer 106-1.

Figure 3:
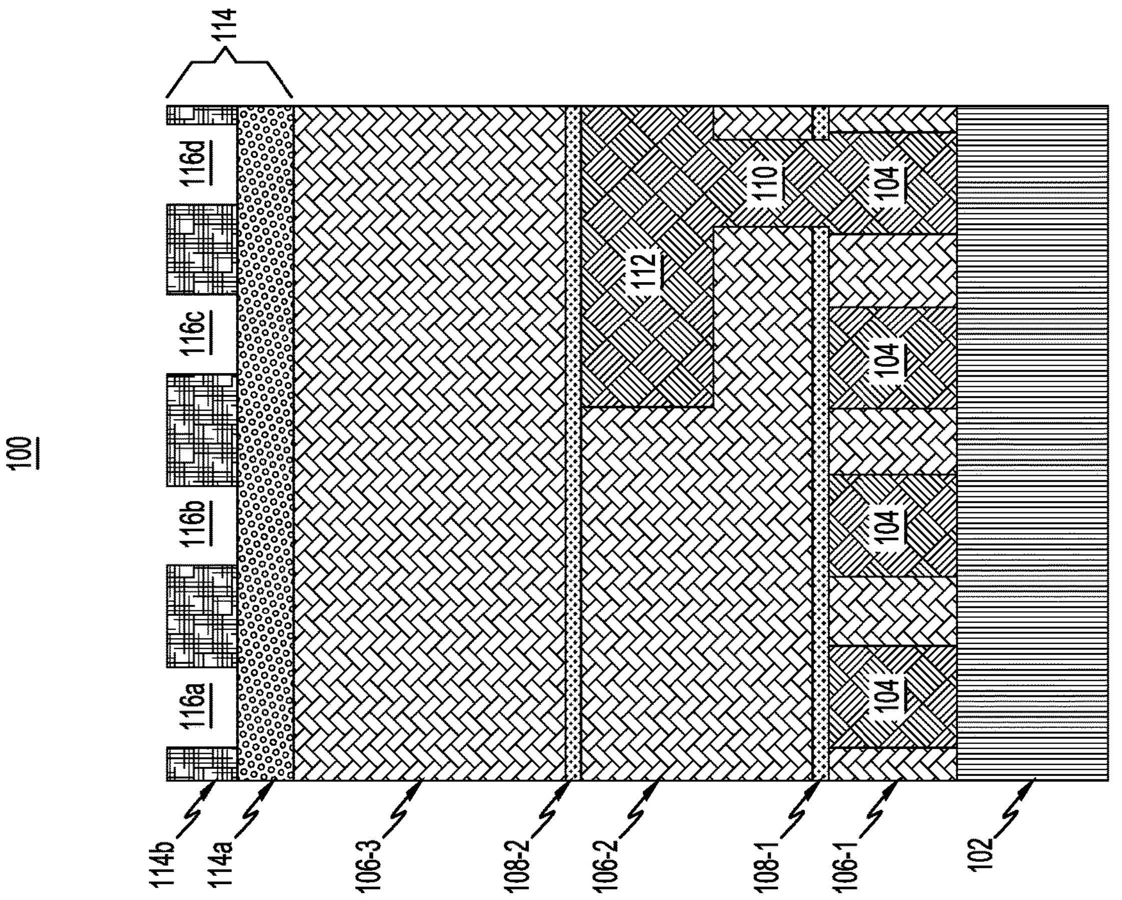
FIG. 3 is a cross-sectional view illustrating the semiconductor structure at a third-intermediate fabrication stage, according to an illustrative embodiment.

FIG. 3 illustrates a cross-sectional view of semiconductor structure 100 at a third-intermediate fabrication stage. During this stage, a bilayer hardmask 114 is formed by first depositing a first layer 114*a* on dielectric layer 106-3 utilizing any conventional deposition technique such as PVD, ALD, CVD, etc. First layer 114*a* includes, for example, any suitable sacrificial material such as SiN, AlOx, etc.

Second layer 114*b* is deposited on the top surface of first layer 114*a* by conventional deposition techniques such as ALD, CVD, PVD or spin on deposition. Suitable material for second layer 114*b* includes any hardmask material such as, for example, TiN, $SiO_2$, TaN, SiN, AlOx, SiC and the like. Second layer 114*b* is patterned by forming metal containing lines and a skip via in third metallization layer $M_{x+1}$, as discussed below, and by forming openings 116*a*, 116*b*, 116*c* and 116*d* using standard lithographic processing.

Figure 4:
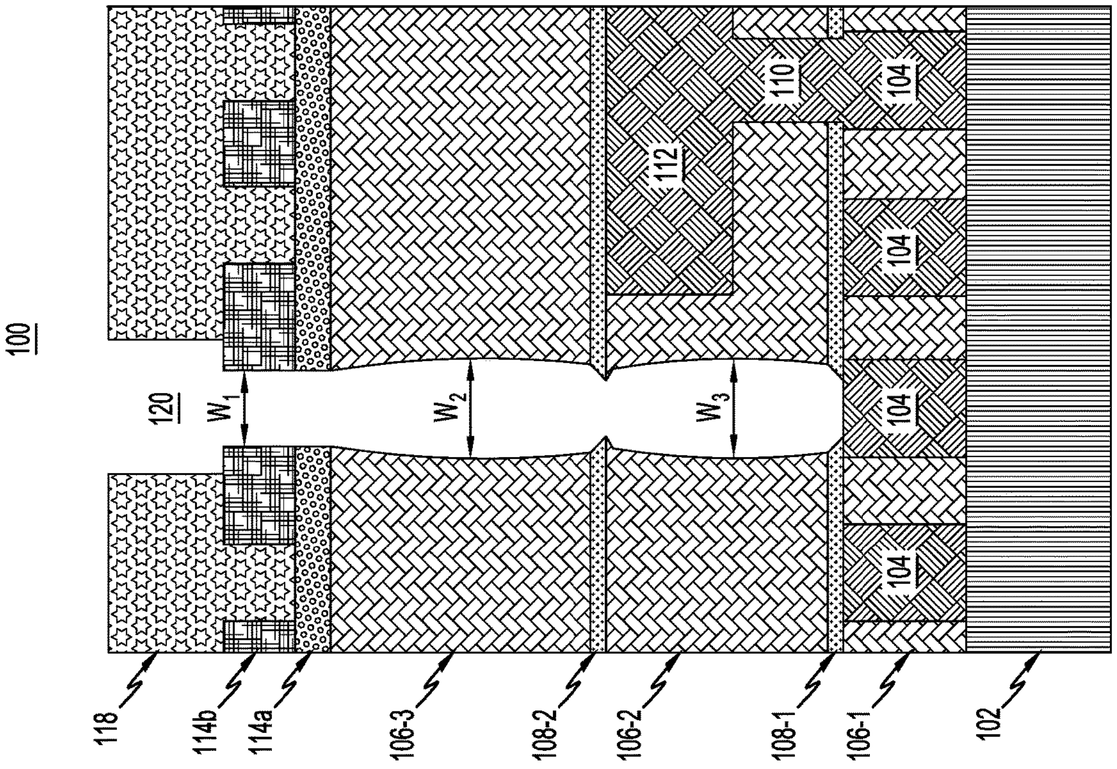
FIG. 4 is a cross-sectional view illustrating the semiconductor structure at a fourth-intermediate fabrication stage, according to an illustrative embodiment.

FIG. 4 illustrates a cross-sectional view of semiconductor structure 100 at a fourth-intermediate fabrication stage. During this stage, skip via opening 120 is formed through opening 116*b*, first layer 114*a*, dielectric layers 106-3 and 106-2, etch stop layers 108-2 and 108-1 and exposing a top surface of one of metal containing lines 104 in first metallization level $M_{x-1}$. Skip via opening 120 is formed by first depositing a mask layer 118 (such as an organic planarization layer (OPL) or a spin-on-carbon (SOC)) in openings 116*a*, 116*b*, 116*c* and 116*d* and on second layer 114*b*, followed by a standard planarization process (e.g., CMP) to planarize the upper surface. A suitable conventional deposition process can be spin-on coating or any other suitable deposition process.

Next, the mask layer 118 is patterned and a selective etch process such as reactive ion etching (ME) can be carried out to form skip via opening 120. When forming skip via opening 120, a first portion of skip via opening 120 disposed in dielectric layer 106-2 will be formed having a varying width "$W_3$" and a second portion of skip via opening 120 disposed in ILD layer 106-3 will be formed having a varying width "$W_2$" with widths $W_2$ and $W_3$ being greater than width $W_1$ of opening 116*b* (see FIG. 3).

Figure 5:
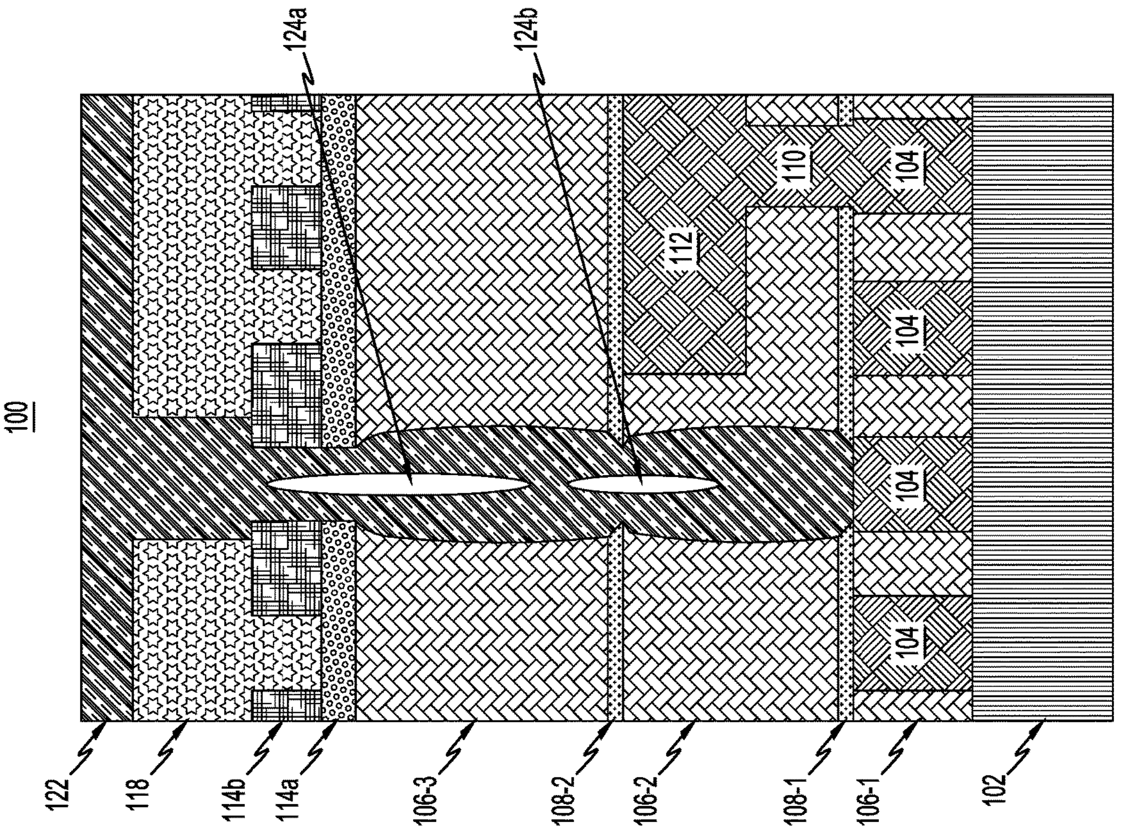
FIG. 5 is a cross-sectional view illustrating the semiconductor structure at a fifth-intermediate fabrication stage, according to an illustrative embodiment.

FIG. 5 illustrates a cross-sectional view of semiconductor structure 100 at a fifth-intermediate fabrication stage. During this stage, dielectric fill 122 is deposited in skip via opening 120 by conventional deposition techniques such as ALD. Dielectric fill 122 can comprise any suitable high-k dielectric material including, for example, AlOx, AN, and HfOx. In illustrative embodiments, air gaps 124*a* and 124*b* may be formed in the dielectric fill 122 during deposition.

Figure 6:
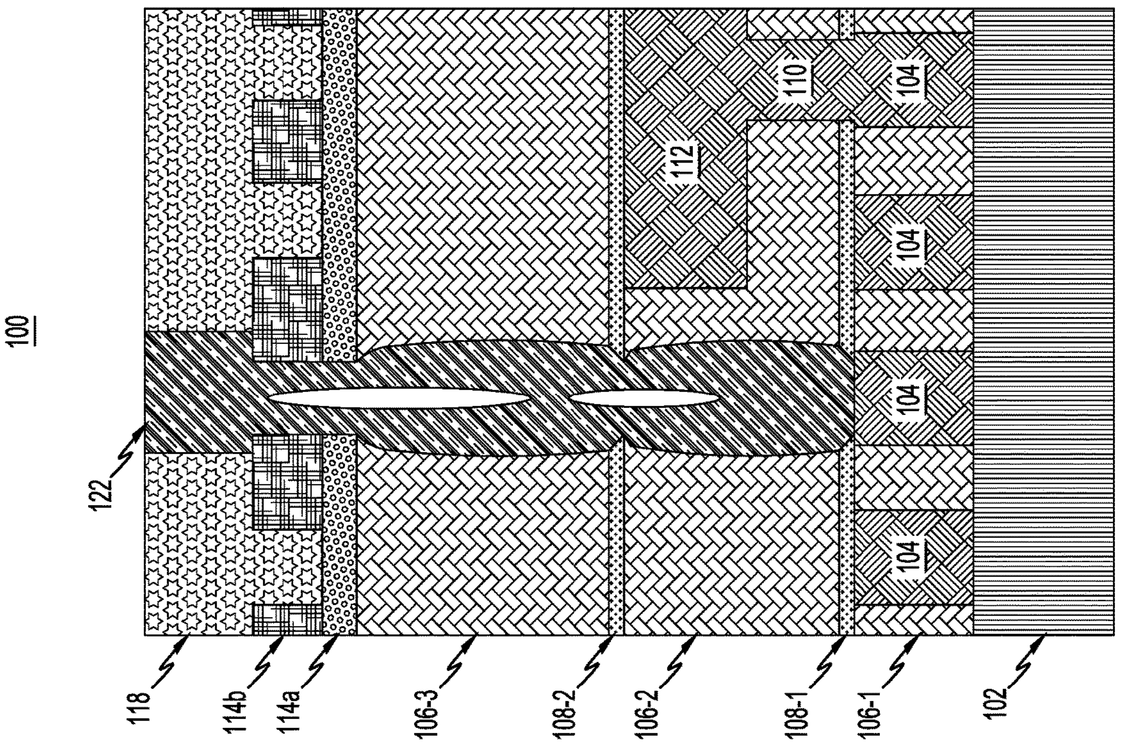
FIG. 6 is a cross-sectional view illustrating the semiconductor structure at a sixth-intermediate fabrication stage, according to an illustrative embodiment.

FIG. 6 illustrates a cross-sectional view of semiconductor structure 100 at an optional sixth-intermediate fabrication stage. During this stage, an optional etch back such an isotropic etch back can be carried out to remove excess dielectric fill 122 on top of semiconductor structure 100. Following the etch back process, a top surface of dielectric fill 122 can be coplanar with a top surface of mask layer 118.

Figure 7:
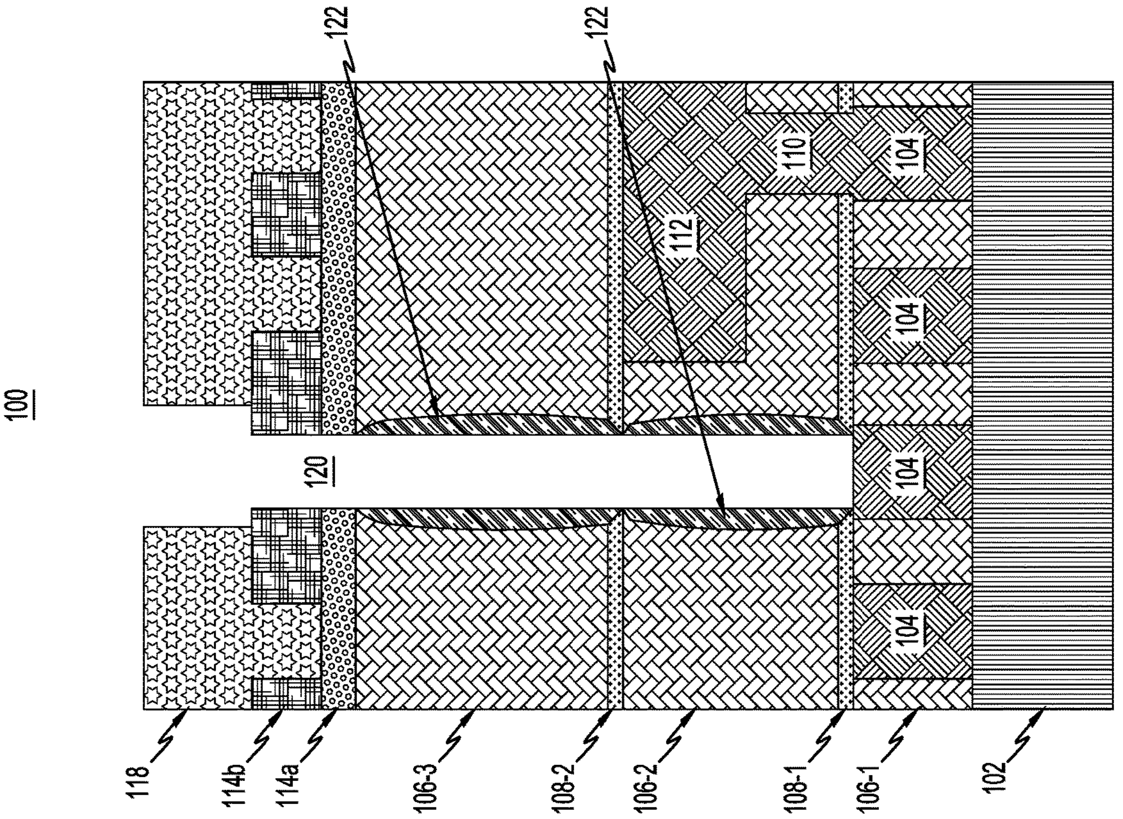
FIG. 7 is a cross-sectional view illustrating the semiconductor structure at a seventh-intermediate fabrication stage, according to an illustrative embodiment.

FIG. 7 illustrates a cross-sectional view of semiconductor structure 100 at a seventh-intermediate fabrication stage. During this stage, dielectric fill 122 is selectively removed by a suitable etching process such as ME. In illustrative embodiments, a portion of dielectric fill 122 remains on sidewalls of dielectric layer 106-3 so that skip via opening 120 has a uniform width from the uppermost portion to the lowermost portion. In other illustrative embodiments, dielectric fill 122 disposed on sidewalls of the skip via opening 120 defines an opening such that dielectric fill 122 has uniform sidewalls from an uppermost portion of the opening to a lowermost portion of the opening. In addition, by forming skip via opening 120 with widths $W_2$ and $W_3$ discussed above, dielectric fill 122 located on the sidewalls of the skip via opening 120 has a varying thickness, and the dielectric fill 122 has a uniform flush surface in contact with the conductive material disposed in skip via opening 120 as discussed below (see FIG. 10).

Figure 8:
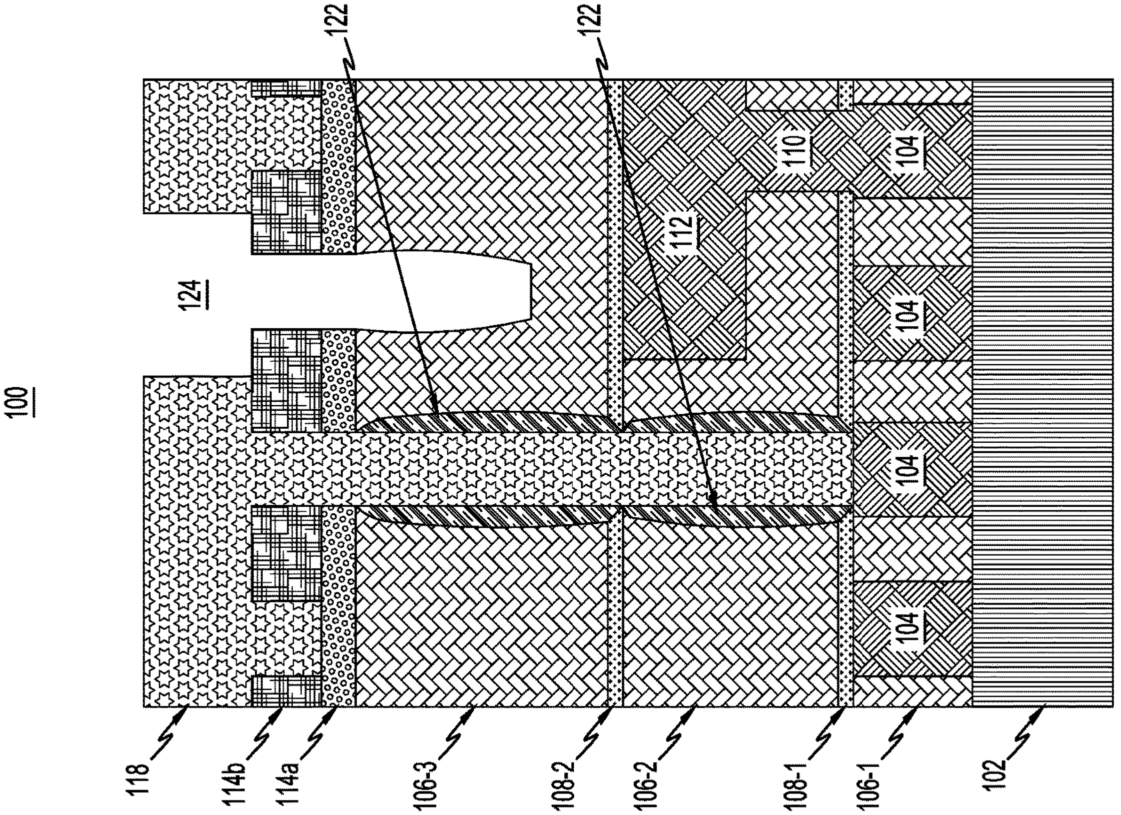
FIG. 8 is a cross-sectional view illustrating the semiconductor structure at an eighth-intermediate fabrication stage, according to an illustrative embodiment.

FIG. 8 illustrates a cross-sectional view of semiconductor structure 100 at an eighth-intermediate fabrication stage. During this stage, second level $V_x$ patterning is carried out by depositing an additional mask layer 118 in skip via opening 120 and over semiconductor structure 100 and then patterning and selectively etching the additional mask layer 118 using, for example, RIE, to form a via 124.

Figure 9:
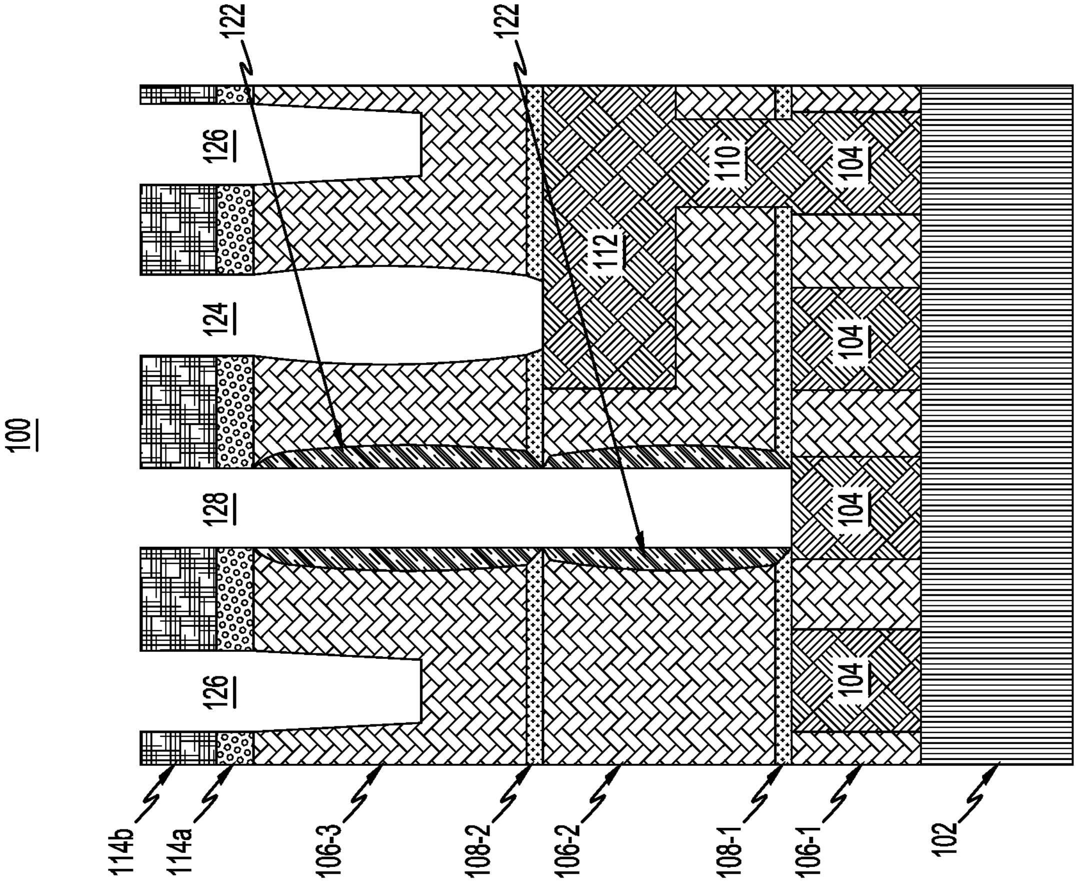
FIG. 9 is a cross-sectional view illustrating the semiconductor structure at a ninth-intermediate fabrication stage, according to an illustrative embodiment.

FIG. 9 illustrates a cross-sectional view of semiconductor structure 100 at a ninth-intermediate fabrication stage. During this stage, third metallization layer $M_{x+1}$ patterning is carried out by patterning mask layer 118 and selectively etching to form metal conductive line openings 126 and further etching via 124 through etch stop layer 108-2 to expose a top surface of metal containing line 112. A suitable etching process can be any selective wet or dry etch. Mask layer 118 is then removed by, for example, an ash etching process to form via 124, metal conductive line openings 126 and skip via opening 128.

Figure 10:
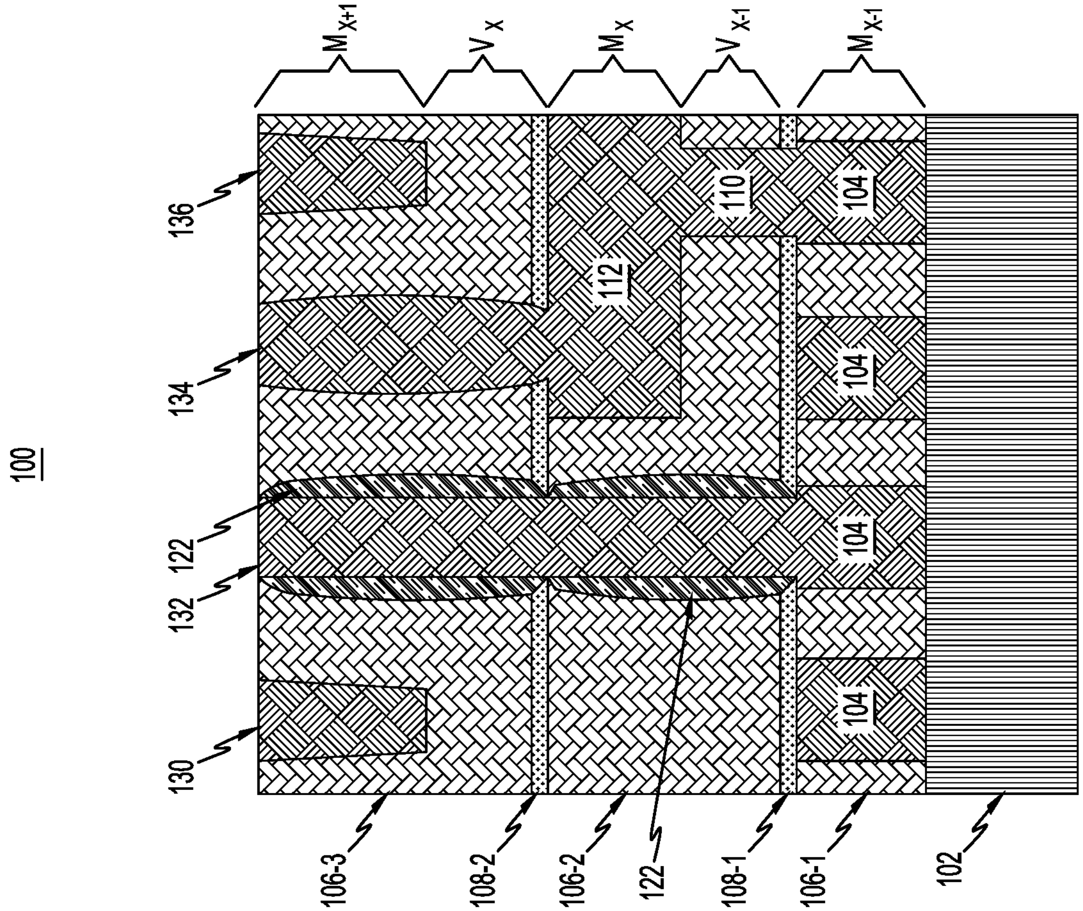
FIG. 10 is a cross-sectional view illustrating the semiconductor structure at a tenth-intermediate fabrication stage, according to an illustrative embodiment.

FIG. 10 illustrates a cross-sectional view of semiconductor structure 100 at a tenth-intermediate fabrication stage. During this stage, a conductive metal is deposited in via 124, metal conductive line openings 126 and skip via opening 128 using any conventional technique such as ALD, CVD, PVD, and/or plating. Suitable conductive metal includes any conductive metal discussed above for metal containing lines 104. Following deposition of the conductive metal, third metallization layer $M_{x+1}$ and second via level $V_x$ are formed with metal containing lines 130 and 136, metal via 134 and skip via 132. In illustrative embodiments, the dielectric layer 122 has a uniform flush surface in contact with the conductive material in the skip via 132.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a skip via disposed on a metal line of a first metallization layer; and a dielectric layer disposed on vertical sidewalls of the skip via to define an opening having a uniform width;

wherein the dielectric layer has uniform sidewalls from an uppermost portion of the opening to a lowermost portion of the opening; and wherein an opposing vertical sidewall of the dielectric layer is a continuous non-uniform sidewall of varying widths from an uppermost portion of the dielectric layer to a lowermost portion of the dielectric layer.

2. The semiconductor structure according to claim 1, further comprising:

a first metal via disposed on another metal line of the first metallization layer; and a second metallization layer disposed on the first metal via.

3. The semiconductor structure according to claim 2, wherein the first metal via and the second metallization layer are disposed in a first interlayer dielectric layer.

4. The semiconductor structure according to claim 3, wherein a portion of the skip via is disposed in the first interlayer dielectric layer.

5. The semiconductor structure according to claim 4, further comprising:

a second metal via disposed on the second metallization layer; and a third metallization layer comprising a plurality of metal lines, wherein a metal line of the plurality of metal lines is disposed on the second metal via.

6. The semiconductor structure according to claim 5, wherein the second metal via and the third metallization layer are disposed in a second interlayer dielectric layer.

7. The semiconductor structure according to claim 6, wherein another portion of the skip via is disposed in the second interlayer dielectric layer.

8. The semiconductor structure according to claim 1, wherein the dielectric layer comprises a high-k dielectric material.

9. The semiconductor structure according to claim 1, further comprising a conductive material disposed in the opening;

wherein the dielectric layer has a uniform flush surface in contact with the conductive material.

10. A semiconductor structure, comprising:

a skip via disposed on a metal line of a first metallization layer, the skip via comprising a first portion disposed in a first interlayer dielectric layer, and a second portion disposed in a second interlayer dielectric layer; and a dielectric layer disposed on vertical sidewalls of the first portion and the second portion of the skip via to define an opening having a uniform width, the dielectric layer having a varying thickness;

wherein the dielectric layer has uniform sidewalls from an uppermost portion of the opening to a lowermost portion of the opening; and wherein an opposing vertical sidewall of the dielectric layer is a continuous non-uniform sidewall of varying widths from an uppermost portion of the dielectric layer to a lowermost portion of the dielectric layer.

11. The semiconductor structure according to claim 10, wherein a conductive material is part of the skip via.

12. The semiconductor structure according to claim 10, further comprising:

a first metal via disposed on another metal line of the first metallization layer; and a second metallization layer disposed on the first metal via.

13. The semiconductor structure according to claim 12, wherein the first metal via and the second metallization layer are disposed in the first interlayer dielectric layer.

14. The semiconductor structure according to claim 13, further comprising:

a second metal via disposed on the second metallization layer; and a third metallization layer comprising a plurality of metal lines, wherein a metal line of the plurality of metal lines is disposed on the second metal via.

15. The semiconductor structure according to claim 14, wherein the second metal via and the third metallization layer are disposed in the second interlayer dielectric layer.

16. An integrated circuit, comprising:

one or more semiconductor structures, wherein at least one of the one or more semiconductor structures comprises:

a skip via disposed on a metal line of a first metallization layer; and a dielectric layer disposed on vertical sidewalls of the skip via to define an opening having a uniform width;

wherein the dielectric layer has uniform sidewalls from an uppermost portion of the opening to a lowermost portion of the opening; and wherein an opposing vertical sidewall of the dielectric layer is a continuous non-uniform sidewall of varying widths from an uppermost portion of the dielectric layer to a lowermost portion of the dielectric layer.

17. The integrated circuit according to claim 16, wherein the at least one of the one or more semiconductor structures further comprises:

a first metal via disposed on another metal line of the first metallization layer; and a second metallization layer disposed on the first metal via;

wherein the first metal via and the second metallization layer are disposed in a first interlayer dielectric layer.

18. The integrated circuit according to claim 17, wherein a portion of the skip via is disposed in the first interlayer dielectric layer.

19. The integrated circuit according to claim 18, wherein the at least one of the one or more semiconductor structures further comprises:

a second metal via disposed on the second metallization layer; and a third metallization layer comprising a plurality of metal lines, wherein a metal line of the plurality of metal lines is disposed on the second metal via;

wherein the second metal via and the third metallization layer are disposed in a second interlayer dielectric layer.

20. The integrated circuit according to claim 19, wherein another portion of the skip via is disposed in the second interlayer dielectric layer.

* * * * *